United States Patent
Lassalle-Balier et al.

(10) Patent No.: US 11,467,233 B2
(45) Date of Patent: *Oct. 11, 2022

(54) LINEAR BRIDGES HAVING NONLINEAR ELEMENTS

(71) Applicant: Allegro MicroSystems, LLC, Manchester, NH (US)

(72) Inventors: Rémy Lassalle-Balier, Bures sur Yvette (FR); Jean-Michel Daga, Marseilles (FR); Damien Dehu, La-Ville-du-Bois (FR)

(73) Assignee: Allegro MicroSystems, LLC, Manchester, NH (US)

( * ) Notice: Subject to any disclaimer, the term of this patent is extended or adjusted under 35 U.S.C. 154(b) by 278 days.

This patent is subject to a terminal disclaimer.

(21) Appl. No.: 16/822,488

(22) Filed: Mar. 18, 2020

(65) Prior Publication Data

US 2021/0293910 A1 Sep. 23, 2021

(51) Int. Cl.
*G01R 33/09* (2006.01)
*G01D 5/14* (2006.01)

(52) U.S. Cl.
CPC .............. *G01R 33/098* (2013.01); *G01D 5/14* (2013.01)

(58) Field of Classification Search
CPC .............. G01R 33/098; G01R 33/0023; G01R 33/093; G01D 5/14
See application file for complete search history.

(56) References Cited

U.S. PATENT DOCUMENTS

| 7,936,144 | B2 | 5/2011 | Vig et al. |
| 8,084,969 | B2 | 12/2011 | David et al. |
| 8,138,708 | B2 | 3/2012 | Ward et al. |
| 8,461,782 | B2 | 6/2013 | Ward et al. |
| 8,629,642 | B2 | 1/2014 | Ward et al. |

(Continued)

FOREIGN PATENT DOCUMENTS

| DE | 10 2016 104285 A1 | 9/2016 |
| DE | 10 2015 218 855 A1 | 3/2017 |

(Continued)

OTHER PUBLICATIONS

PCT International Search Report and Written Opinion dated Sep. 6, 2021 for International Application No. PCT/US2021/034432; 15 Pages.

(Continued)

*Primary Examiner* — Douglas W Owens
(74) *Attorney, Agent, or Firm* — Daly, Crowley, Mofford & Durkee, LLP (57) ABSTRACT

In one aspect, a bridge includes a first magnetoresistance element having a first reference angle, a second magnetoresistance element in series with the first magnetoresistance element and having a second reference angle, a third magnetoresistance element in parallel with the first magnetoresistance element and having the first reference angle and a fourth magnetoresistance element in series with the third magnetoresistance element and having the second reference angle. An output of the bridge has a linear response over a range of horizontal magnetic field intensity values not centered about a zero value and a reference angle indicates an angle the magnetoresistance element is most sensitive to changes in a magnetic field.

22 Claims, 13 Drawing Sheets

(56) References Cited

U.S. PATENT DOCUMENTS

| | | | |
|---|---|---|---|
| 8,716,959 | B2 | 5/2014 | David et al. |
| 8,736,316 | B2 | 5/2014 | Chaware et al. |
| 8,873,944 | B2 | 10/2014 | Latham et al. |
| 9,042,716 | B2 | 5/2015 | Cadugan et al. |
| 9,322,887 | B1 | 4/2016 | Eagen et al. |
| 9,354,284 | B2 | 5/2016 | Latham |
| 9,470,765 | B1 | 10/2016 | Latham |
| 9,529,060 | B2 | 12/2016 | Fermon et al. |
| 9,605,975 | B2 | 3/2017 | Foletto et al. |
| 9,605,979 | B2 | 3/2017 | Eagen et al. |
| 9,625,535 | B2 | 4/2017 | Cadugan et al. |
| 9,719,806 | B2 | 8/2017 | Foletto et al. |
| 9,720,054 | B2 | 8/2017 | Drouin et al. |
| 9,784,594 | B2 | 10/2017 | David et al. |
| 9,804,234 | B2 | 10/2017 | Dressler et al. |
| 9,812,637 | B2 | 11/2017 | Fermon et al. |
| 9,823,090 | B2 | 11/2017 | Foletto et al. |
| 9,823,092 | B2 | 11/2017 | David et al. |
| 9,880,026 | B1 | 1/2018 | Eagen et al. |
| 9,910,087 | B2 | 3/2018 | Eagen et al. |
| 9,922,673 | B2 | 3/2018 | Campiglio et al. |
| 10,036,785 | B2 | 7/2018 | David et al. |
| 10,041,810 | B2 | 8/2018 | Vig et al. |
| 10,114,085 | B2 | 10/2018 | Eagen et al. |
| 10,290,608 | B2 | 5/2019 | Latham et al. |
| 10,310,028 | B2 | 6/2019 | Latham et al. |
| 10,330,745 | B2 | 6/2019 | Eagen et al. |
| 10,347,277 | B2 | 7/2019 | Campiglio et al. |
| 10,509,058 | B2 | 12/2019 | Cadugan et al. |
| 10,557,725 | B2 | 2/2020 | Paul et al. |
| 10,557,726 | B2 | 2/2020 | Lassalle-Balier |
| 10,557,873 | B2 | 2/2020 | Latham |
| 10,585,152 | B2 | 3/2020 | David et al. |
| 11,175,359 | B2* | 11/2021 | Lassalle-Balier .... G01R 33/093 |
| 2002/0191451 | A1 | 12/2002 | Kishi et al. |
| 2005/0128654 | A1 | 6/2005 | Sapozhnikov |
| 2006/0267581 | A1 | 11/2006 | Wiese |
| 2009/0189601 | A1 | 7/2009 | Okada et al. |
| 2010/0073827 | A1 | 3/2010 | Zhao et al. |
| 2010/0271013 | A1 | 10/2010 | Servel et al. |
| 2010/0301845 | A1 | 12/2010 | Acker |
| 2011/0037459 | A1 | 2/2011 | Okada et al. |
| 2011/0285395 | A1 | 11/2011 | van Veldhoven et al. |
| 2012/0038348 | A1 | 2/2012 | Aimuta et al. |
| 2012/0095712 | A1 | 4/2012 | Komasaki et al. |
| 2012/0119729 | A1 | 5/2012 | Komasaki et al. |
| 2013/0113478 | A1 | 5/2013 | Pant |
| 2013/0335070 | A1 | 12/2013 | Abe et al. |
| 2014/0028307 | A1 | 1/2014 | Ausserlechner |
| 2014/0225605 | A1 | 8/2014 | Lei et al. |
| 2015/0192432 | A1 | 7/2015 | Noguchi et al. |
| 2016/0169707 | A1 | 6/2016 | Hirota et al. |
| 2016/0313412 | A1* | 10/2016 | Li ...................... H01L 43/10 |
| 2017/0322052 | A1 | 11/2017 | Paul et al. |
| 2018/0224300 | A1 | 8/2018 | Vig et al. |
| 2018/0335484 | A1 | 11/2018 | Campiglio et al. |
| 2018/0335486 | A1 | 11/2018 | Lassalle-Balier et al. |
| 2019/0219643 | A1 | 7/2019 | Cadugan et al. |
| 2019/0234764 | A1 | 8/2019 | Lassalle-Balier |
| 2019/0383646 | A1 | 12/2019 | Lassalle-Balier et al. |
| 2020/0018780 | A1 | 1/2020 | Cadugan et al. |
| 2020/0033424 | A1 | 1/2020 | Campiglio et al. |
| 2020/0041310 | A1 | 2/2020 | Lassalle-Balier et al. |
| 2020/0041583 | A1 | 2/2020 | Cadugan et al. |
| 2020/0041584 | A1 | 2/2020 | Lassalle-Balier et al. |
| 2020/0064413 | A1 | 2/2020 | Campiglio et al. |
| 2020/0066790 | A1* | 2/2020 | Lassalle-Balier ....... H01L 43/08 |
| 2020/0379064 | A1* | 12/2020 | Yuan ...................... G01C 17/28 |
| 2022/0043082 | A1* | 2/2022 | Lassalle-Balier .... G01R 33/098 |

FOREIGN PATENT DOCUMENTS

| | | |
|---|---|---|
| DE | 10 2018 113821 A1 | 12/2018 |
| EP | 2 674 728 A2 | 12/2013 |
| JP | 2011-158488 | 8/2011 |
| JP | 2014-071039 A | 4/2014 |
| WO | WO 2019/152112 A1 | 8/2019 |
| WO | WO 2021/040797 A1 | 3/2021 |

OTHER PUBLICATIONS

PCT International Preliminary Report dated Mar. 10, 2022 for International Application No. PCT/US2020/046883; 9 Pages.
Extended European Search Report dated Jul. 29, 2021 for European Application No. 21156380.4; 9 Pages.
PCT International Search Report and Written Opinion dated Oct. 23, 2020 for International Application No. PCT/US2020/046883; 15 Pages.
U.S. Appl. No. 16/139,742, filed Sep. 24, 2018, Romero.
U.S. Appl. No. 16/145,841, filed Sep. 28, 2018, Foletto et al.
U.S. Appl. No. 16/157,313, filed Oct. 11, 2018, Lassalle-Balier et al.
U.S. Appl. No. 16/157,317, filed Oct. 11, 2018, Lassalle-Balier et al.
U.S. Appl. No. 16/232,348, filed Dec. 26, 2018, Eagen et al.
U.S. Appl. No. 16/244,452, filed Jan. 10, 2019, Lassalle-Balier et al.
U.S. Appl. No. 16/280,199, filed Feb. 20, 2019, Liu et al.
U.S. Appl. No. 16/397,162, filed Apr. 29, 2019, Kulla et al.
U.S. Appl. No. 16/398,522, filed Apr. 30, 2019, Cesaretti et al.
U.S. Appl. No. 16/420,470, filed May 23, 2019, Tran et al.
U.S. Appl. No. 16/507,544, filed Jul. 10, 2019, David et al.
U.S. Appl. No. 16/507,552, filed Jul. 10, 2019, Lassalle-Balier et al.
U.S. Appl. No. 16/507,560, filed Jul. 10, 2019, Lassalle-Balier et al.
U.S. Appl. No. 16/522,810, filed Jul. 26, 2019, David et al.
U.S. Appl. No. 16/533,030, filed Aug. 6, 2019, Romero et al.
U.S. Appl. No. 16/553,633, filed Aug. 28, 2019, Lassalle-Balier et al.
U.S. Appl. No. 16/683,800, filed Nov. 14, 2019, David et al.
U.S. Appl. No. 16/749,074, filed Jan. 22, 2020, Romero.
U.S. Appl. No. 16/800,229, filed Feb. 25, 2020, Lassalle-Balier et al.
U.S. Non-Final Office Action dated May 17, 2019 for U.S. Appl. No. 15/884,619; 29 Pages.
Response to U.S. Non-Final Office Action dated May 17, 2019 for U.S. Appl. No. 15/884,619; Response filed Jun. 24, 2019; 10 Pages.
U.S. Notice of Allowance dated Feb. 15, 2019 for U.S. Appl. No. 15/884,619; 12 Pages.
U.S. Notice of Allowance dated Sep. 4, 2019 for U.S. Appl. No. 15/884,619; 16 Pages.
PCT International Search Report and Written Opinion dated Mar. 14, 2019 for International Application No. PCT/US2018/066995; 13 Pages.
Jaffrés et al., "Angular Dependence of the Tunnel Magnetoresistance in Transition-Metal-Based Junctions;" Physical Review B, vol. 64, 064427; Jul. 2001; 7 Pages.
U.S. Appl. No. 16/921,191, filed Jul. 6, 2020, Lassalle-Balier.

* cited by examiner

LINEAR BRIDGES HAVING NONLINEAR ELEMENTS

BACKGROUND

The term "magnetic-field sensing element" is used to describe a variety of electronic elements that can sense a magnetic field. The magnetic-field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic-field sensing elements tend to have an axis of maximum sensitivity parallel to a substrate that supports the magnetic-field sensing element, and others of the above-described magnetic-field sensing elements tend to have an axis of maximum sensitivity perpendicular to a substrate that supports the magnetic-field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

SUMMARY

In one aspect, a bridge includes a first magnetoresistance element having a first reference angle, a second magnetoresistance element in series with the first magnetoresistance element and having a second reference angle, a third magnetoresistance element in parallel with the first magnetoresistance element and having the first reference angle and a fourth magnetoresistance element in series with the third magnetoresistance element and having the second reference angle. An output of the bridge has a linear response over a range of horizontal magnetic field intensity values not centered about a zero value and a reference angle indicates an angle the magnetoresistance element is most sensitive to changes in a magnetic field.

In another aspect, a method of forming a bridge that includes a first type of magnetoresistance elements and a second type of magnetoresistance elements. The method includes measuring a magnetic field response for a magnetoresistance element at different tilt angles; for each tilt angle, measuring a resistance of the magnetoresistance element; using the measured resistance for each tilt angle, determining a value for each resistance combination of the first type and the second type of magnetoresistance elements; selecting the value indicating an output of the bridge has a linear response over a range of horizontal magnetic field intensity values not centered about a zero value; selecting a first reference angle for the first type of magnetoresistance elements corresponding to the selected value; and selecting a second reference angle for the second type of magnetoresistance elements corresponding to the selected value. The first reference angle indicates an angle the first type of magnetoresistance elements is most sensitive to changes in a magnetic field.

In a further aspect, a camera includes a magnetic field sensor comprising a bridge. The bridge includes a first magnetoresistance element having a first reference angle, a second magnetoresistance element in series with the first magnetoresistance element and having a second reference angle, a third magnetoresistance element in parallel with the first magnetoresistance element and having the first reference angle and a fourth magnetoresistance element in series with the third magnetoresistance element and having the second reference angle. An output of the bridge has a linear response over a range of horizontal magnetic field intensity values not centered about a zero value, and a reference angle indicates an angle the magnetoresistance element is most sensitive to changes in a magnetic field.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate bridges for linear magnetometers (linear bridges) using nonlinear magnetoresistance elements, such as, for example, giant magnetoresistance (GMR) elements or tunneling magnetoresistance (TMR) elements. In some examples, the techniques described herein may be used to construct linear magnetometers that are linear in magnetic field trajectories and ranges where magnetoresistance elements are typically not linear.

Figure 1:
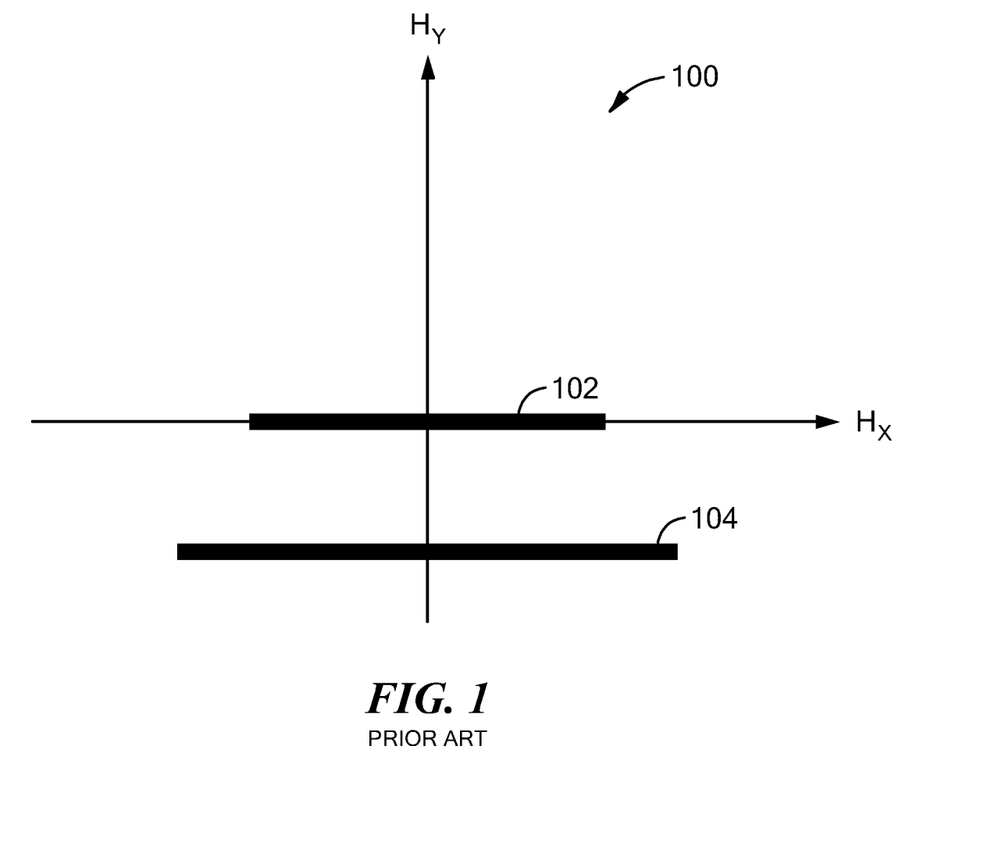
FIG. 1 is a graph of an example of magnetic field trajectories for a linear magnetic field sensor.

Referring to FIG. 1, a linear trajectory is a straight line in Hx and Hy space where Hx represents a horizontal magnetic field intensity and Hy represents a vertical magnetic field intensity. A graph 100 includes examples of linear trajectories from linear magnetic field sensors that are centered about Hx=0 Oersted (Oe). In one example, a linear trajectory 102 is centered about Hx=0 Oe and has a Hy=0 Oe. In another example, a linear trajectory 104 is centered about Hx=0 Oe and has a Hy=a fixed nonzero value.

As will be further described herein, TMR elements and GMR elements may be used to construct bridges that have a linear response. For example, using the techniques described herein, an output of a bridge that includes TMR elements or GMR elements has a linear response with respect to the horizontal magnetic field.

Figure 2:
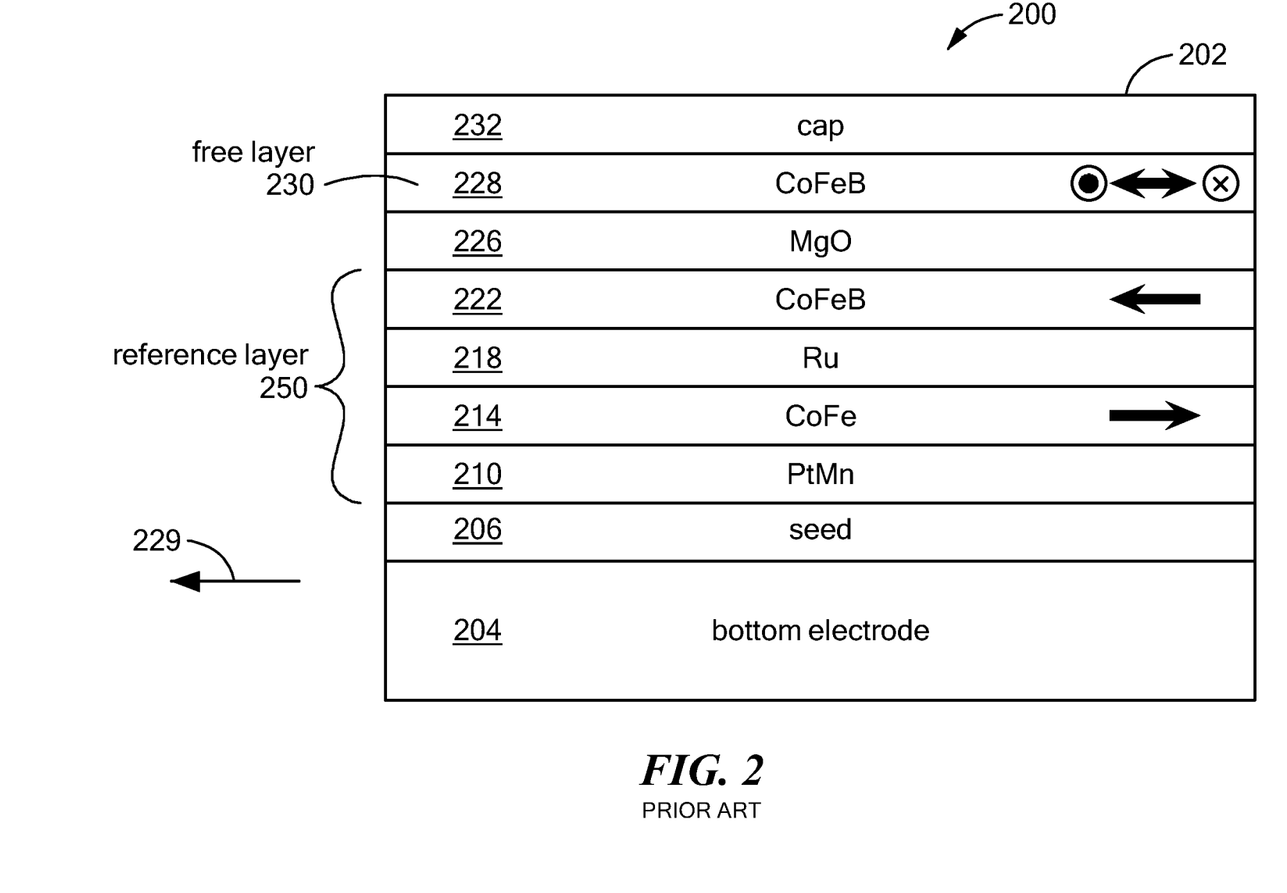
FIG. 2 is a block diagram of a prior art example of a tunneling magnetoresistance (TMR) element.

Referring to FIG. 2, an illustrative TMR element 200 can have a stack 202 of layers 206, 210, 214, 218, 222, 226, 228, 232, indicative of one pillar of a multi-pillar TMR element. Generally, the layer 206 is a seed layer (e.g., a copper nickel (CuN) layer) with the layer 210 located on the seed layer 206. The layer 210 includes platinum manganese (PtMn) or iridium manganese (IrMn), for example. The layer 214 is located on the layer 210 and the layer 218 is located on the layer 214. In one example, the layer 214 includes cobalt iron (CoFe) and the layer 218 is a spacer layer and includes ruthenium (Ru). On the layer 218, a magnesium oxide (MgO) layer 226 is sandwiched between two cobalt iron boron (CoFeB) layers 222, 228. A cap layer 232 (e.g., tantalum (Ta)) is located on the CoFeB layer 228. The layer 214 is a single layer pinned layer that is magnetically coupled to the layer 210. The physical mechanism that is coupling layers 210 and 214 together is sometimes called an exchange bias.

A free layer 230 includes the CoFeB layer 228. In some examples, the free layer 230 may include an additional layer of nickel iron (NiFe) (not shown) and a thin layer of tantalum (not shown) between the CoFeB layer 228 and the NiFe layer.

It will be understood that a driving current running through the TMR element 200 runs through the layers of the stack, running between seed and cap layers 206 and 232, i.e., perpendicular to a surface of a bottom electrode 204. The TMR element 200 can have a maximum response axis that is parallel to the surface of the bottom electrode 204 and that is in a direction 229, and also parallel to the magnetization direction of the reference layer 250, comprised of layers 210, 214, 218, and 222, most notably in the layer CoFeB 222.

The TMR element 200 has a maximum response axis (maximum response to external fields) aligned with the arrow 229, and parallel to magnetic fields of the reference layer 250, notably pinned layer 222. Also, in general, it is rotations of the magnetic direction of the free layer 230 caused by external magnetic fields that result in changes of resistance of the TMR element 200, which may be due to a change in angle or a change in amplitude if an external bias is present because the sum vector of the external field and the bias is causing a change in the angle between the reference and free layers.

Figure 3:
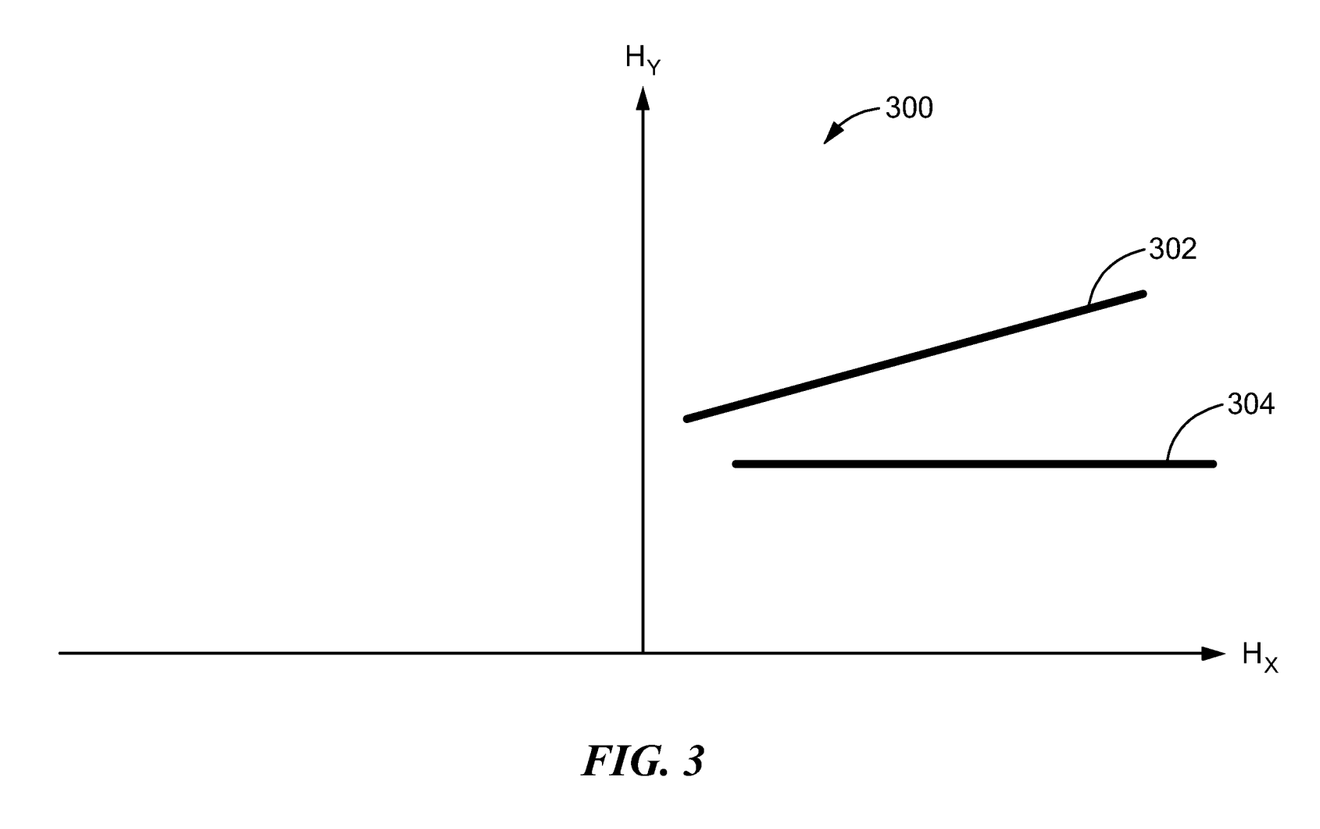
FIG. 3 is a graph of an example of magnetic field linear trajectories for a bridge that includes magnetoresistance (MR) elements.

Referring to FIG. 3, TMR elements and GMR elements may be used to construct bridges that have linear trajectories; however, these trajectories are not centered about the vertical axis (Hy) or not parallel to the sensor sensitive axis or neither of both. For example, a linear trajectory 302 and a linear trajectory 304 are not centered about the vertical axis (Hy axis). These linear trajectories may be used to construct bridges that have an output that has a linear response with respect to a horizontal magnetic field (Hx).

Figure 4:
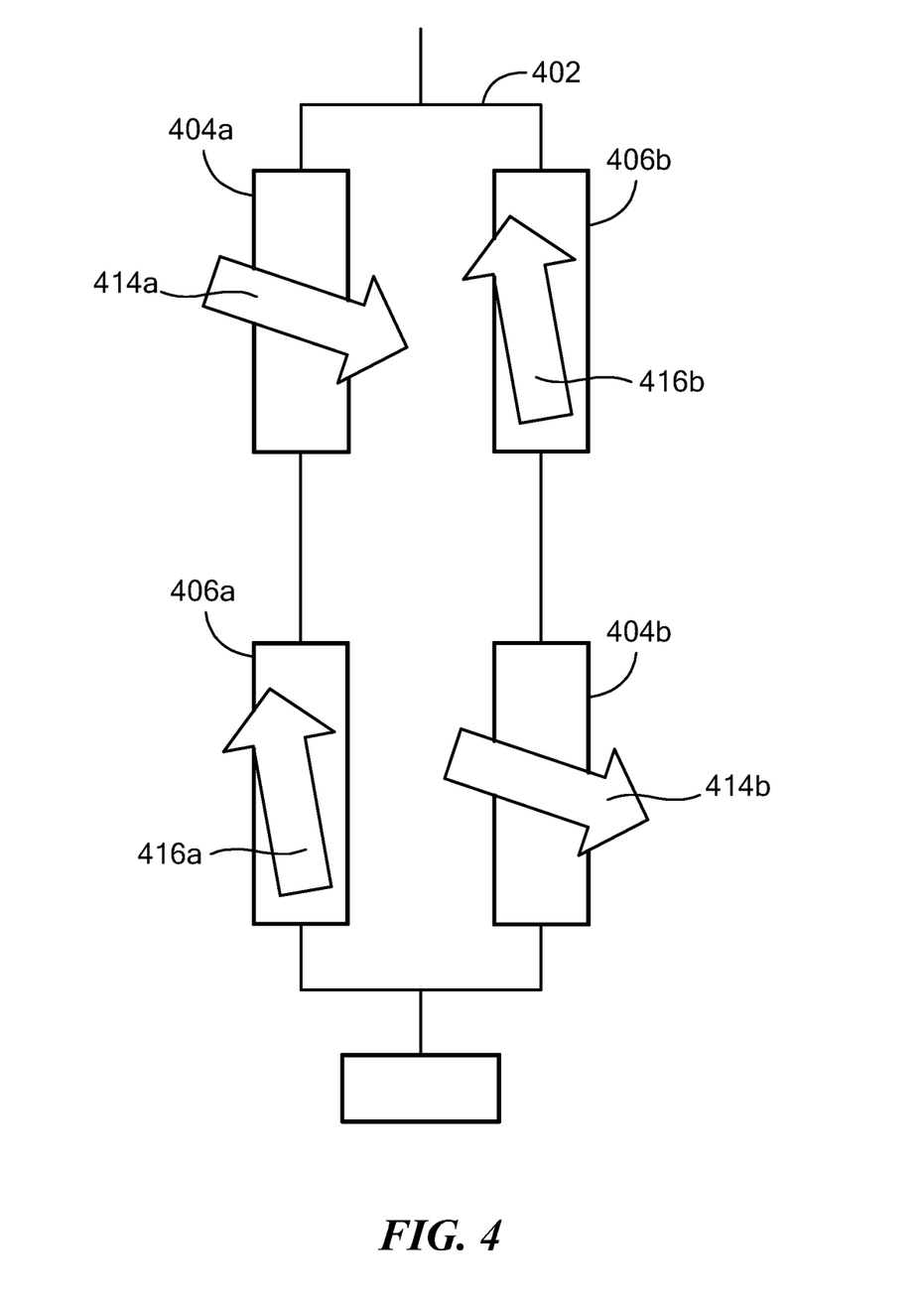
FIG. 4 is a circuit diagram of an example of the bridge that includes MR elements.

Referring to FIG. 4, an example of a linear bridge is a bridge 402. In one example, the bridge 402 is a current-driven bridge.

The bridge 402 includes a magnetoresistance (MR) element 404a, an MR element 404b, an MR element 406a and an MR element 406b. Each MR element 404a, 404b, 406a, 406b includes a reference direction. For example, the MR element 404a includes a reference direction 414a, the MR element 404b includes a reference direction 414b, the MR element 406a includes a reference direction 416a and the MR element 406b includes a reference direction 416b. As used herein, a reference direction (sometimes referred to herein as a reference angle) indicates the direction the MR element is most sensitive to an external magnetic field.

The MR element 404a and the MR element 404b are a first type of MR element that is the MR elements 404a, 404b are electrically the same and their reference angles 414a, 414b are equal. The first type of MR element has a resistance, $R_{type1}$.

The MR element 406a and the MR element 406b are a second type of MR element that is the MR elements 406a, 406b are electrically the same and their reference angles 416a, 416b are equal. The second type of MR element has a resistance, $R_{type2}$.

As will be further described herein, in order to achieve a bridge that has an output that has a linear response, the reference angle 414a, 414b and the reference angle 416a, 416b are determined. In the example, where the linear bridge 402 is a current driven bridge, the output voltage of the bridge is equal to $Icc*(R_{type1}-R_{type2})$, where Icc is the current that supplies the bridge 402.

In one example, with the reference angle 414a, 414b and the reference angle 416a, 416b determined, the MR elements 404a, 404b provide most of the signal from the linear bridge 402 by setting a reference direction the MR elements 406a, 406b of the second type may offset the nonlinearity of the MR elements 404a, 404b of the second type.

Figure 5:
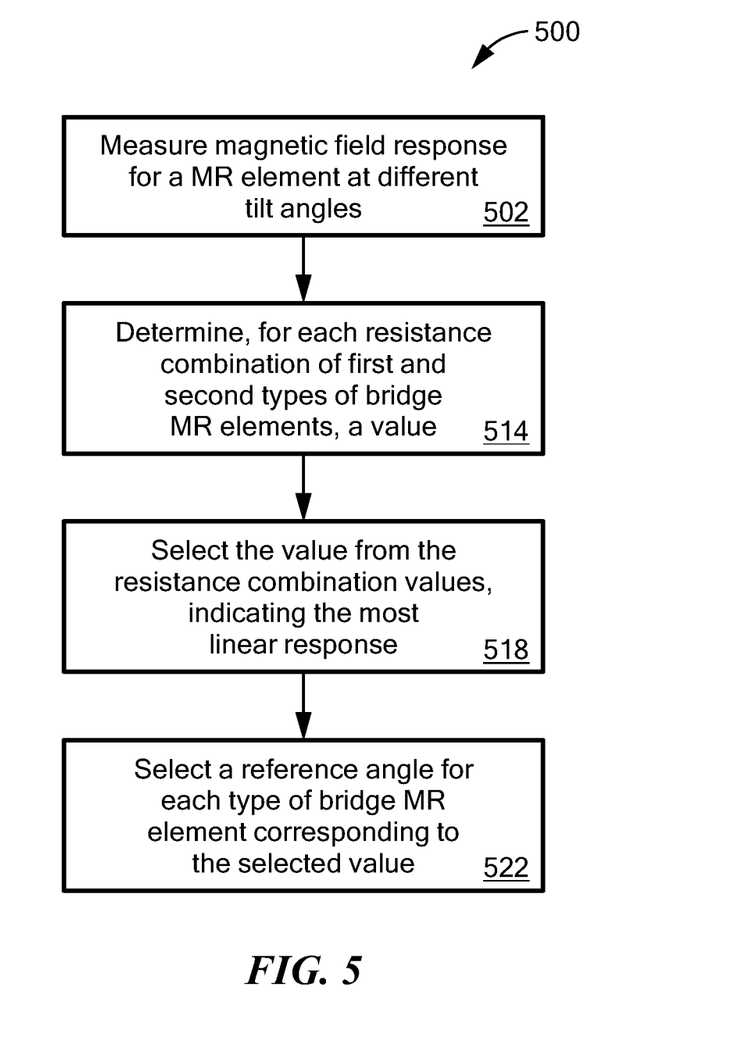
FIG. 5 is a flow diagram of an example of a process to determine reference angles for the MR elements.

Referring to FIG. 5, an example of a process to determine reference angles is a process 500. Process 500 measures a magnetic field response for a MR element at different tilting angles (502).

Process 500 determines, for each resistance combination of first and second types of bridge MR elements, a value (514). For example, a resistance combination is a resistance of the first type of MR element less a resistance of the second type of MR element (e.g., a resistance of the MR element 404a less a resistance of the MR element 406a (see FIG. 4) or ($R_{type1}-R_{type2}$). Each resistance combination has a value. In one example, the value is a linear value having a value between zero and a hundred where zero is the most linear value and 100 is the least linear value.

Process 500 selects a value from the resistance combination values indicating the most linear response (518). For example, a linear value closest to zero is selected.

Process 500 selects a reference angle for each type of bridge MR element corresponding to the selected value (522). For example, the selected value from processing block 518 is associated resistance combination which is associated with a reference angle 414a, 414b for the first type of MR elements 404a, 404b and a reference angle 416a, 416b for the second type of MR elements 406a, 406b.

Figure 6A:
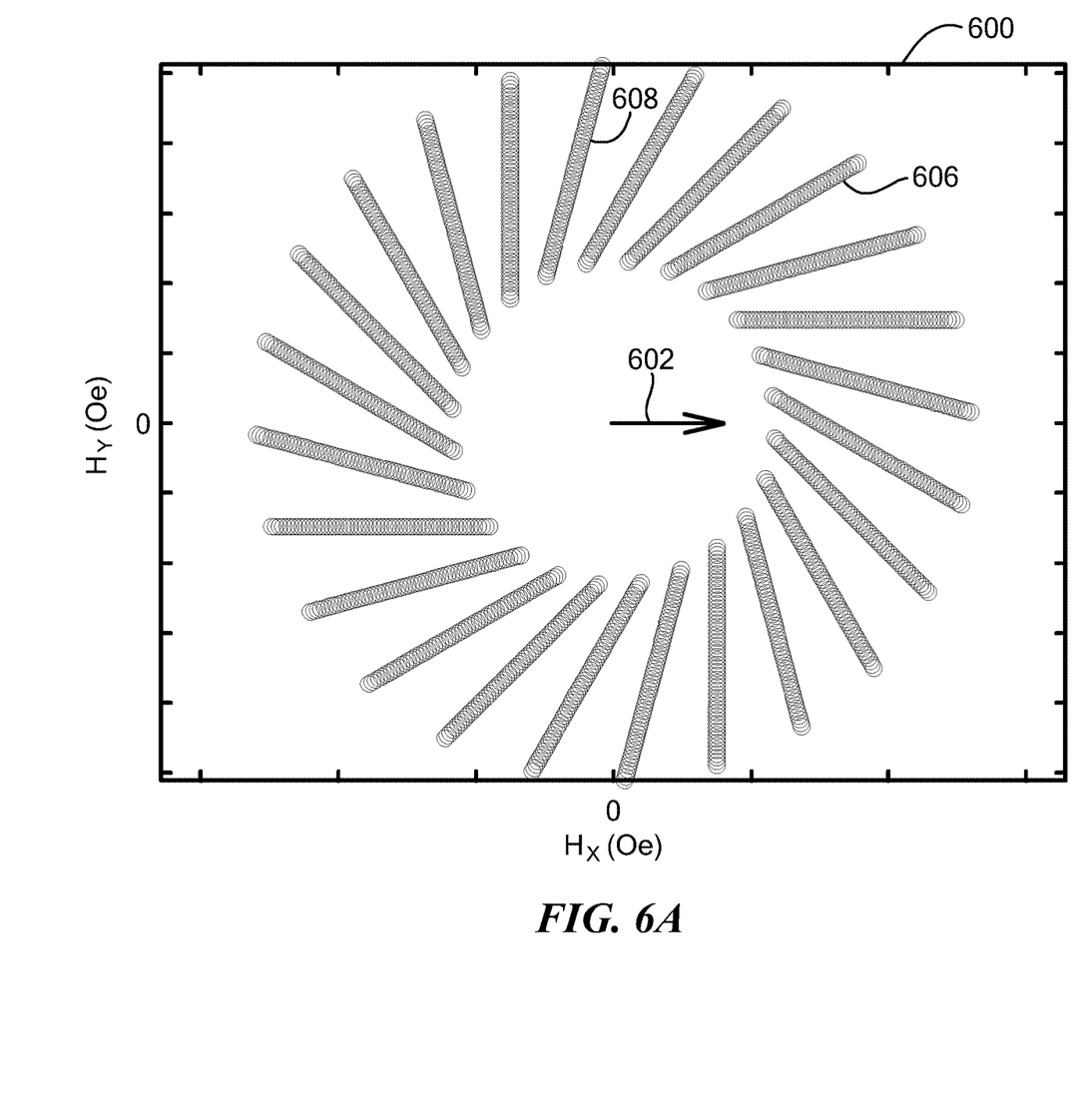
FIG. 6A is a graph of an example of magnetic field trajectories.

Referring to FIG. 6A, a graph 600 depicts various examples of tilted and repeated magnetic field trajectories for an MR element. Each different tiled angle is associate with a difference reference angle. For example, a tilted magnetic field trajectory is a magnetic field trajectory 606 associated with a first reference angle. In another example, a tilted magnetic field trajectory is a magnetic field trajectory 608 associated with a second reference angle. An example of the pinning direction of the MR element is a pinning direction 602 (similar to the pinning direction on layer 222 (FIG. 2).

Figure 6B:
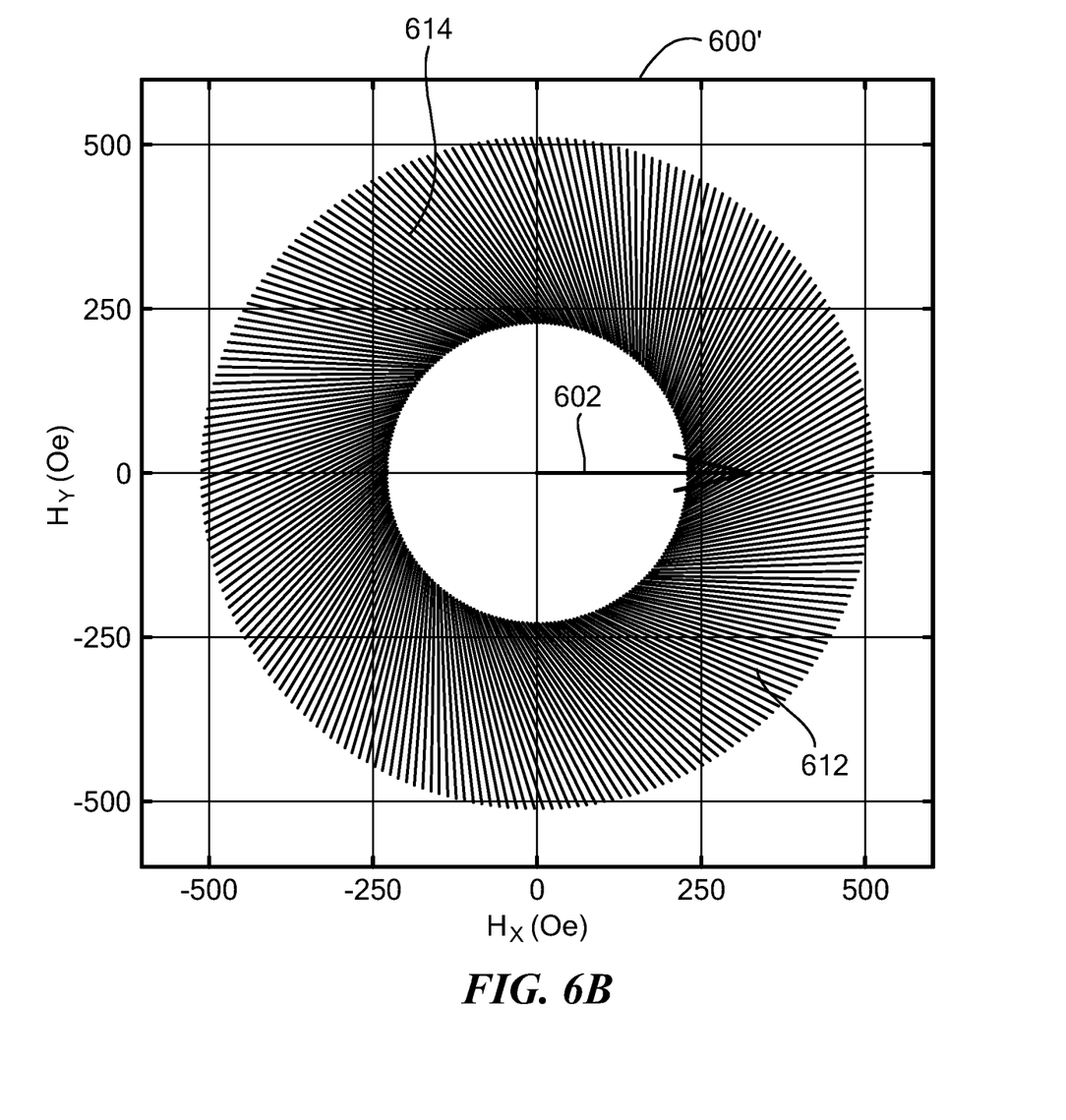
FIG. 6B is a graph of another example of magnetic field trajectories.

Referring to FIG. 6B, another example of the graph 600 is a graph 600'. The graph 600' depicts more than 200 tilted magnetic field trajectories. In the graph 600', a 1.5° angle step is used and a 2.5 Oe magnetic field step is used to produce the more than 200 tilted magnetic field trajectories. Each magnetic field trajectory represents a different reference angle. For example, a magnetic field trajectory 612 is associated with a reference angle of 135° and a magnetic field trajectory 614 is associated with a reference angle of 0°.

Figure 7:
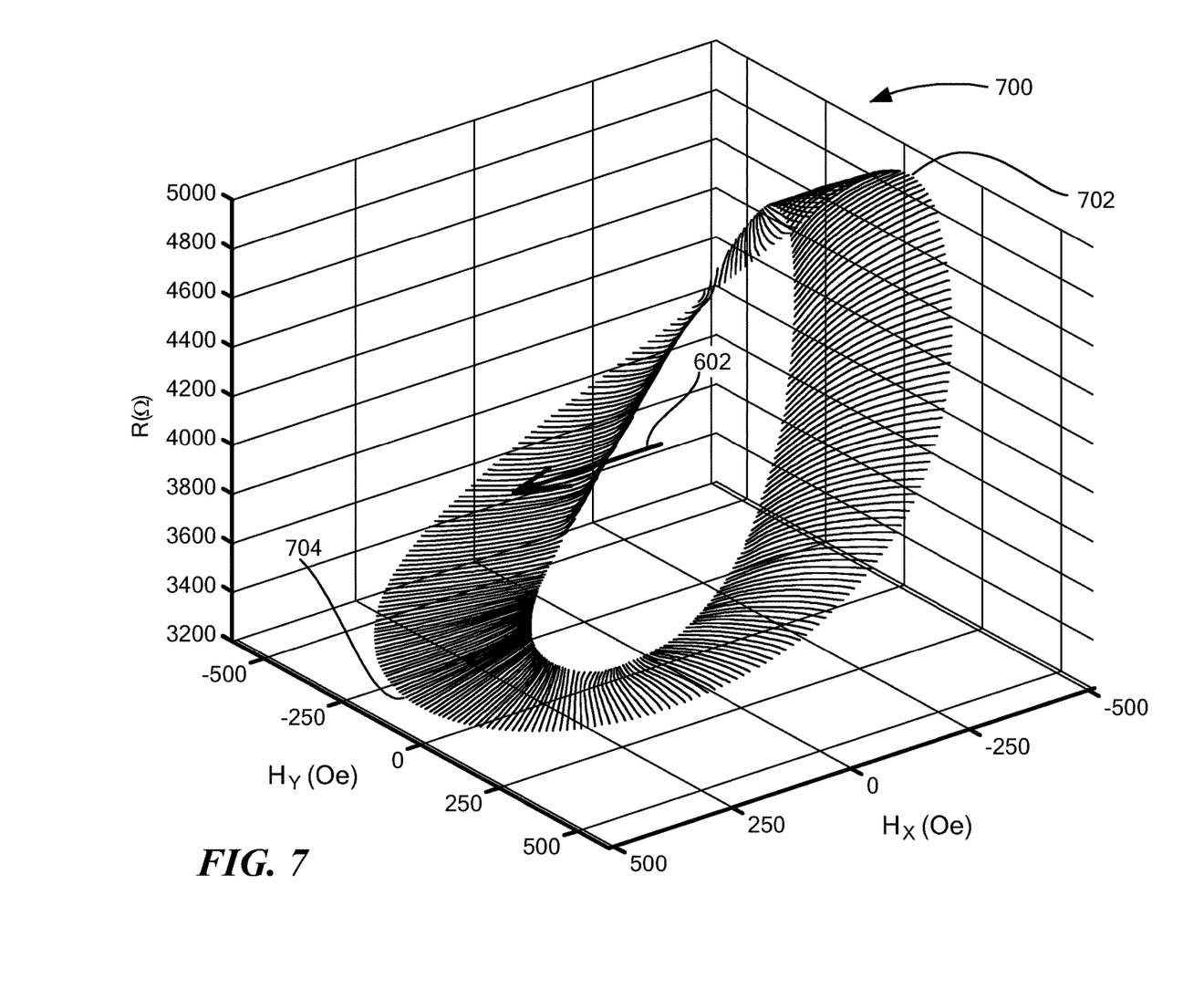
FIG. 7 is a graph of an example of resistance of an MR element with respect to magnetic field trajectories.

Referring to FIG. 7, a graph 700 depicts each line (e.g., a line 702, a line 704) represents the resistance of an MR element with reference 602 with respect to linear trajectory 612, for example.

Figure 8:
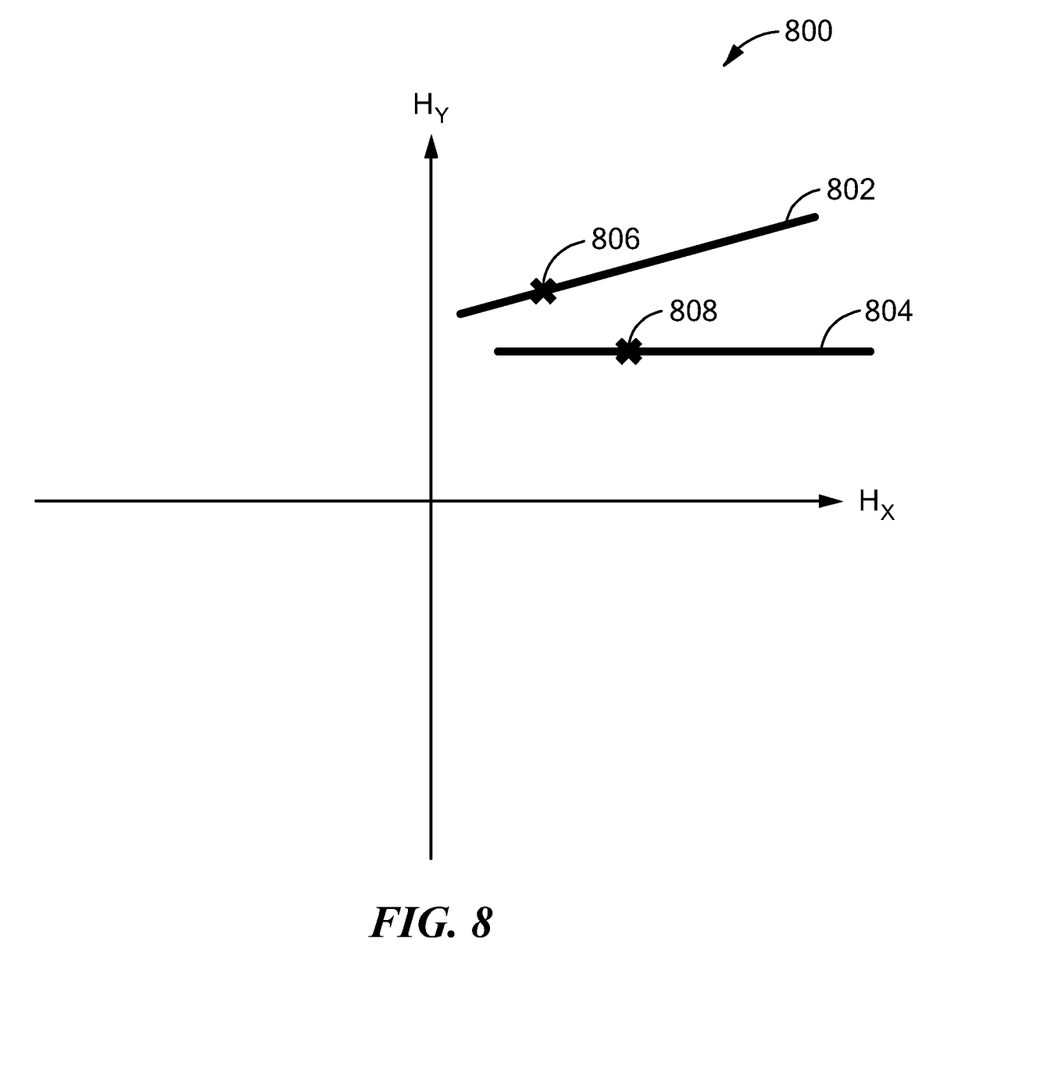
FIG. 8 is a graph of an example of magnetic field trajectories with zero offsets for a bridge that includes MR elements.

Referring to FIG. 8, a graph 800 is identical to graph 300 except the linear trajectories 802, 804 include locations 806, 808, respectively. The locations 806, 808 indicate where in the horizontal magnetic field (Hx) it is desired that the linear bridge produces a zero-voltage output.

Figure 9:
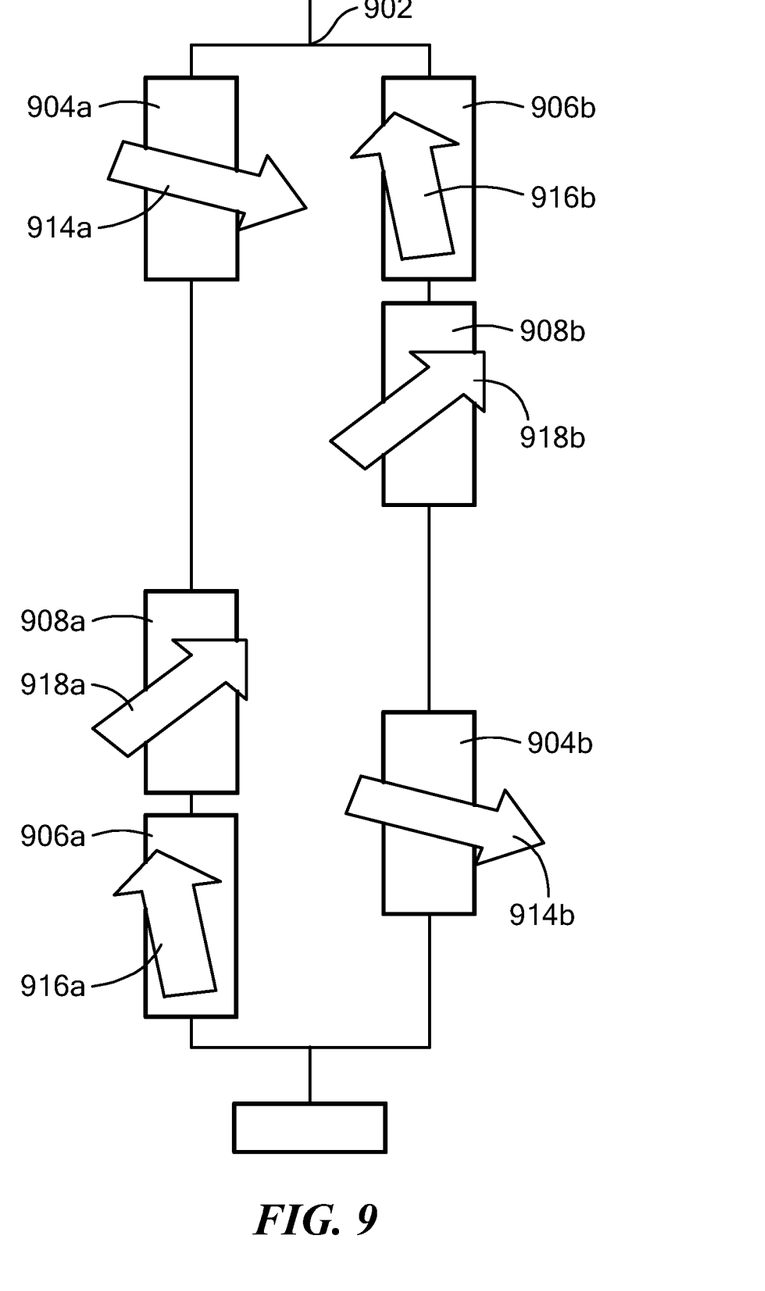
FIG. 9 is a circuit diagram of an example of the bridge that includes MR elements used to generate linear response having a zero voltage.

Referring to FIG. 9, an example of a linear bridge that has an output that is linear but includes a point where the output voltage is zero is a bridge 902. The bridge 902 is similar to the bridge 402 but includes a third type of MR elements. Reference angles for the third type of MR elements are determined to enable that the horizontal magnetic field intensity (Hx) value at the location desired (e.g., either location 806 or the location 808) is a point where the bridge 902 has zero output.

The bridge 902 includes MR element 904a, an MR element 904b, an MR element 906a, an MR element 906b, an MR element 908a and an MR element 908b. Each MR element 904a, 904b, 906a, 906b, 908a, 908b includes a reference direction. For example, the MR element 904a includes a reference direction 914a, the MR element 904b includes a reference direction 914b, the MR element 906a includes a reference direction 916a, the MR element 906b includes a reference direction 916b, the MR element 908a includes a reference direction 918a and the MR element 908b includes a reference direction 918b.

The MR element 904a and the MR element 904b are the first type of MR element that is the MR elements 904a, 904b are electrically the same and their reference angles 914a, 914b are equal.

The MR element 906a and the MR element 906b are the second type of MR element that is the MR elements 906a, 906b are electrically the same and their reference angles 916a, 916b are equal.

The MR element 908a and the MR element 908b are the second type of MR element that is the MR elements 908a, 908b are electrically the same and their reference angles 918a, 918b are equal.

Figure 10:
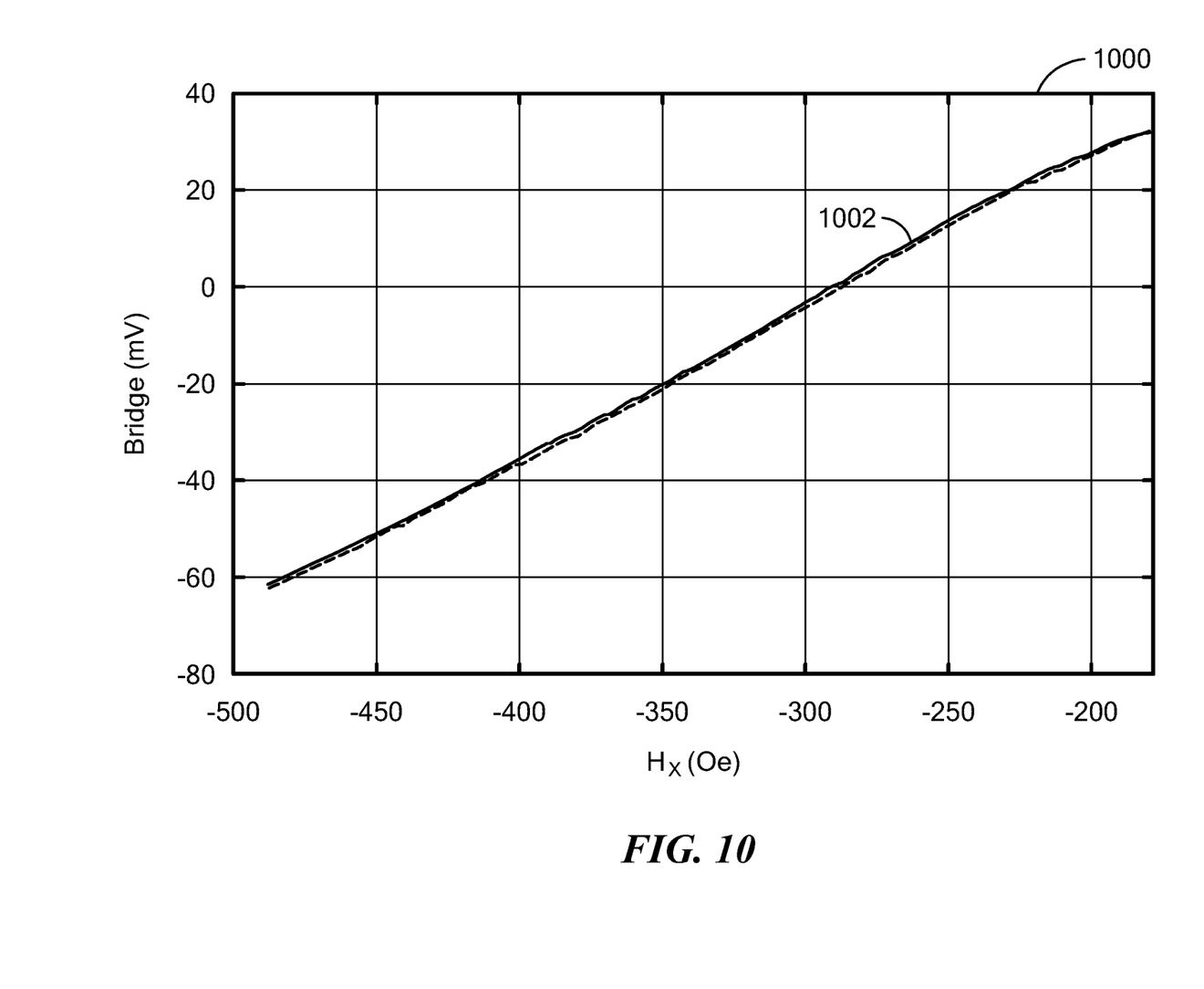
FIG. 10 is a graph of an example of an output of the bridge in FIG. 9.

Referring to FIG. 10, a graph 1000 includes a curve 1002 which is an example, of a voltage output of a bridge, such as for example, the bridge 902 (FIG. 9). The curve 1002 is substantially linear indicating that the bridge output has a linear response with respect to the horizontal magnetic field.

Figure 11:
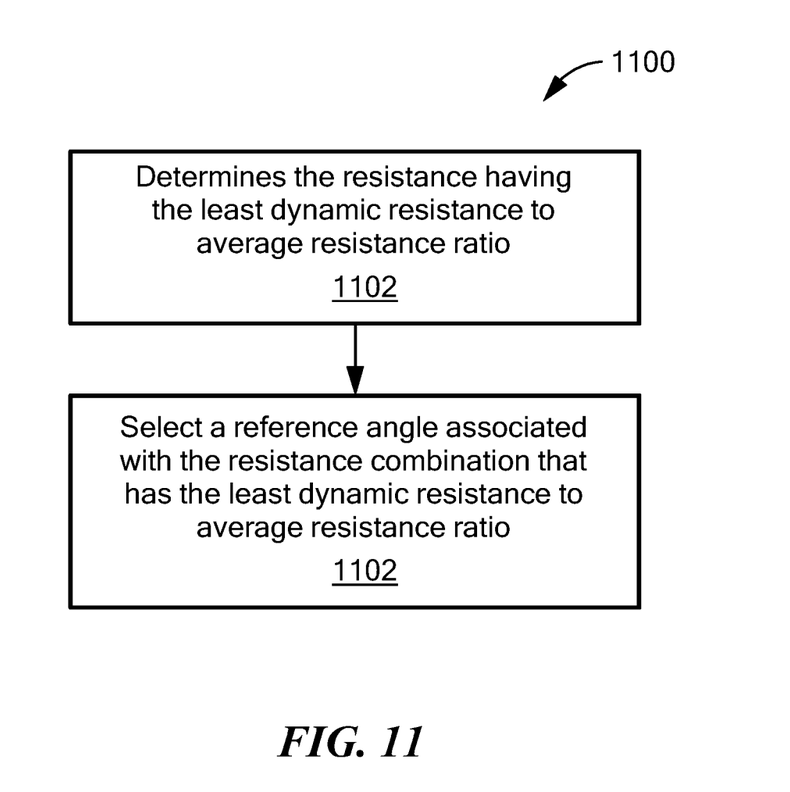
FIG. 11 is a flow diagram of an example of a process to a reference angle for a third type of MR elements in the bridge of FIG. 9.

Referring to FIG. 11, a process to determine the reference angle of the third type of MR elements is a process 1100. Process 1000 determines the resistance that has the least dynamic resistance to average resistance (over the application magnetic field trajectory) ratio (1102). For example, in the graph 700, the resistance that has the least dynamic resistance to average resistance ratio is determined, where the dynamic resistance varies with the applied magnetic field.

Process 1100 selects a reference angle associated with resistance combination that has the least dynamic resistance to average resistance (over the application magnetic field trajectory) ratio (1106). For example, in the graph 700 the reference angle associated with the resistance that has the least dynamic resistance to average resistance ratio is selected.

In other examples, instead of adding MR 908a, 908b elements, a combination of different MR elements with different reference directions may be added that would, once connected together in series or in parallel, produce a small dynamic resistance to average resistance ratio.

Figure 12:
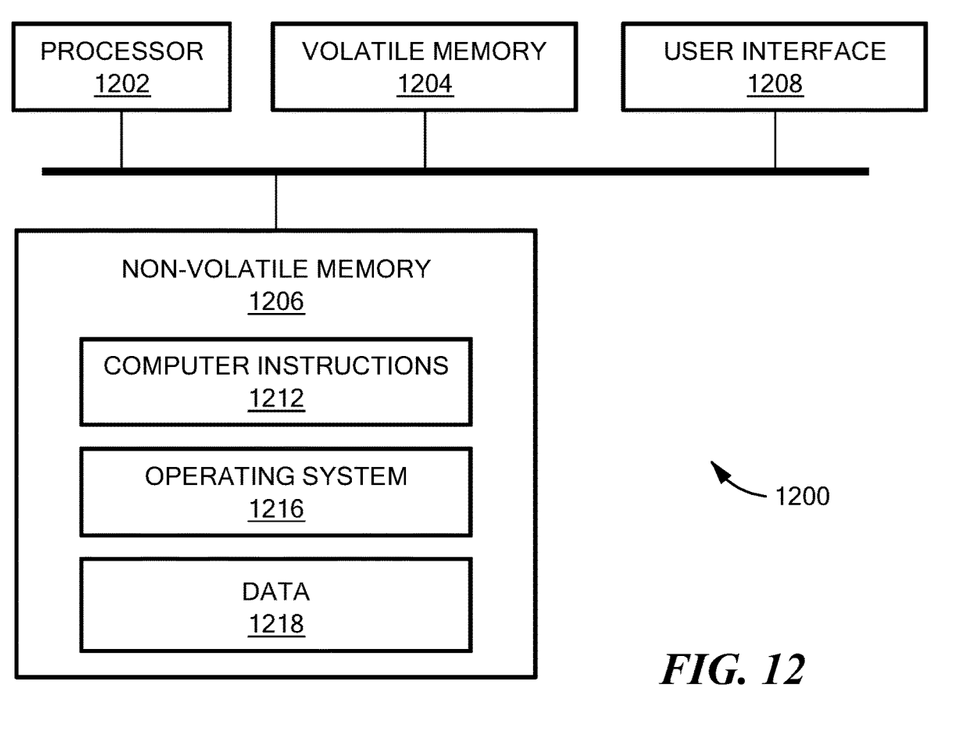
FIG. 12 is a block diagram of an example of a computer on which any of the process of FIG. 5 and/or FIG. 11 may be implemented.

Referring to FIG. 12, an example of a computer is a computer 1200 includes a processor 1202, a volatile memory 1204, a non-volatile memory 1206 (e.g., hard disk) and the user interface (UI) 1208 (e.g., a graphical user interface, a mouse, a keyboard, a display, touch screen and so forth). The non-volatile memory 1206 stores computer instructions 1212, an operating system 1216 and data 1218. In one example, the computer instructions 1212 are executed by the processor 1202 out of volatile memory 1204 to perform all or part of the processes described herein (e.g., processes 500 and 1100).

The processes described herein (e.g., processes 500 and 1100) are not limited to use with the hardware and software of FIG. 12; they may find applicability in any computing or processing environment and with any type of machine or set of machines that is capable of running a computer program. The processes described herein may be implemented in hardware, software, or a combination of the two. The processes described herein may be implemented in computer programs executed on programmable computers/machines that each includes a processor, a non-transitory machine-readable medium or other article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium), for execution by, or to control the operation of, data processing apparatus (e.g., a programmable processor, a computer, or multiple computers)). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

The processes described herein are not limited to the specific examples described. For example, the processes 500 and 1100 are is not limited to the specific processing order of FIGS. 5 and 11, respectively. Rather, any of the processing blocks of FIGS. 5 and 11 may be re-ordered, combined or removed, performed in parallel or in serial, as necessary, to achieve the results set forth above.

The processing blocks (for example, the processes 500 and 1100) associated with implementing the system may be performed by one or more programmable processors executing one or more computer programs to perform the functions of the system. All or part of the system may be implemented as, special purpose logic circuitry (e.g., an FPGA (field-programmable gate array) and/or an ASIC (application-specific integrated circuit)). All or part of the system may be implemented using electronic hardware circuitry that include electronic devices such as, for example, at least one of a processor, a memory, programmable logic devices or logic gates.

Figure 13:
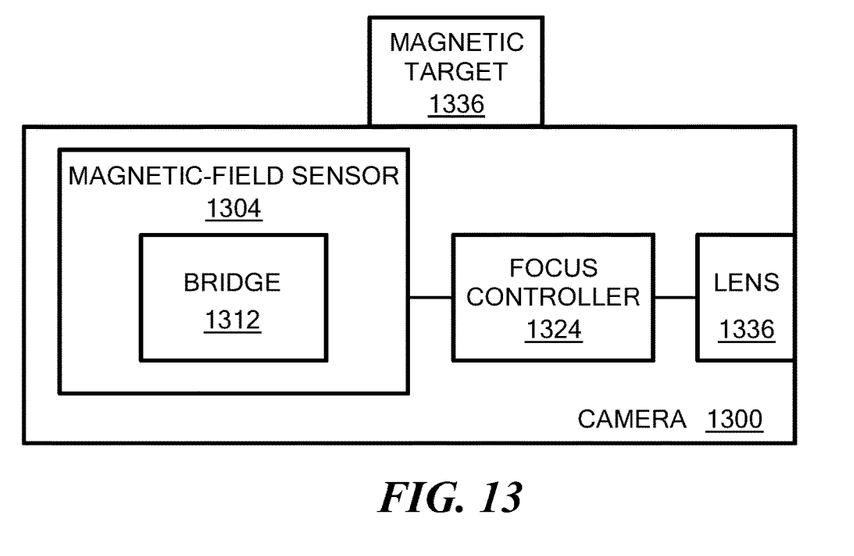
FIG. 13 is block diagram of an example of camera that includes a bridge that includes MR elements.

Referring to FIG. 13, the linear bridges described herein (e.g., the bridge 402, the bridge 1002) may be used in a camera. In one example, the camera may be used in mobile phone. The camera 1300 includes a magnetic-field sensor 1304, a focus controller 1324, a lens 1336 and a magnetic target 1336.

The magnetic-field sensor 1304 includes a bridge 1312. In one example, the bridge 1312 is similar to the bridge 402. In another example, the bridge 1312 is similar to the bridge 1002.

In one example, the magnetic target 1336 may be moved and detected by the magnetic field sensor 1304 to provide an output to the focus controller 1324 to change the focal length of the lens 1336.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A bridge comprising:
   a first magnetoresistance element having a first reference angle;
   a second magnetoresistance element in series with the first magnetoresistance element and having a second reference angle;
   a third magnetoresistance element in parallel with the first magnetoresistance element and having the first reference angle; and
   a fourth magnetoresistance element in series with the third magnetoresistance element and having the second reference angle,
   wherein an output of the bridge has a linear response over a range of horizontal magnetic field values not centered about a zero value,
   wherein the first reference angle and the second reference angle indicates an angle the magnetoresistance element is most sensitive to changes in a magnetic field.

2. The bridge of claim 1, wherein the range of horizontal magnetic field values comprises horizontal magnetic field values none of which have zero values.

3. The bridge of claim 1, wherein the first, second, third and fourth magnetoresistance elements are each a giant magnetoresistance (GMR) element or a tunnel magnetoresistance (TMR) element.

4. The bridge of claim 1, further comprising:
   a fifth magnetoresistance element in series with the first magnetoresistance element and having a third reference angle; and
   a sixth magnetoresistance element in series with the third magnetoresistance element and having the third reference angle,
   wherein the range of horizontal magnetic field values not centered about a zero value comprises a non-zero value corresponding to the output of the bridge having a zero value.

5. The bridge of claim 4, wherein the fifth magnetoresistance element and the sixth magnetoresistance element are constructed to be the same.

6. The bridge of claim 1, wherein the range of horizontal magnetic field values are associated with vertical magnetic field values none of which are 0 Oersted (Oe).

7. The bridge of claim 1, wherein the first reference angle and the second reference angle enable the output of the bridge to have the linear response over the range of horizontal magnetic field values not centered about the zero value.

8. The bridge of claim 7, wherein the first reference angle and the second reference angle enable the output of the bridge to have the linear response over the range of horizontal magnetic field values none of which have zero values.

9. The bridge of claim 1, wherein the first magnetoresistance element and the third magnetoresistance element are constructed to be the same.

10. The bridge of claim 9, wherein the second magnetoresistance element and the fourth magnetoresistance element are constructed to be the same.

11. The bridge of claim 1, wherein the range of horizontal magnetic field values comprises horizontal magnetic field values none of which have zero values,
    wherein the first, second, third and fourth magnetoresistance elements are each a tunnel magnetoresistance (TMR) element.

12. A method of manufacture, comprising:
    constructing a bridge comprising a first type of magnetoresistance elements and a second type of magnetoresistance elements, the constructing comprising:
      measuring a magnetic field response for a magnetoresistance element at different tilt angles;

for each tilt angle, measuring a resistance of the magnetoresistance element;

using the measured resistance for each tilt angle, determining a value for each resistance combination of the first type and the second type of magnetoresistance elements;

selecting the value indicating an output of the bridge has a linear response over a range of horizontal magnetic field values not centered about a zero value;

selecting a first reference angle for the first type of magnetoresistance elements corresponding to the selected value, wherein the first reference angle indicates an angle the first type of magnetoresistance elements is most sensitive to changes in a magnetic field;

selecting a second reference angle for the second type of magnetoresistance elements corresponding to the selected value; and constructing the bridge to include at least two magnetoresistance elements of the first type having the first reference angle and to include at least two magnetoresistance elements of the second type having the second reference angle.

13. The method of claim 12, wherein the second reference angle compensates for non-linearity.

14. The method of claim 12, wherein selecting the value indicating the output of the bridge has a linear response over a range of horizontal magnetic field values not centered about a zero value comprises selecting the value indicating the output of the bridge has a linear response over the range of horizontal magnetic field values comprising only non-zero values.

15. The method of claim 12, wherein measuring the magnetic field response for the magnetoresistance element at different tilt angles comprises measuring a magnetic field response for a magnetoresistance element comprising a giant magnetoresistance (GMR) element or a tunnel magnetoresistance (TMR) element.

16. The method of claim 12, further comprising:
determining, for each tilt angle, the resistance combination that has the lowest change in resistance; and
selecting a third reference angle for a third type of magnetoresistance elements of the bridge corresponding to the lowest change in resistance,
wherein the third reference angle enables the range of horizontal magnetic field values not centered about a zero value to comprise a non-zero value corresponding to the output of the bridge having a zero value.

17. The method of claim 12, wherein selecting the value indicating the output of the bridge has a linear response over a range of horizontal magnetic field values not centered about a zero value comprises selecting the value indicating the output of the bridge has a linear response over the range of horizontal magnetic field values associated with vertical magnetic field values none of which are 0 Oersted (Oe).

18. The method of claim 12, wherein the first reference angle and the second reference angle enable the output of the bridge to have the linear response over the range of horizontal magnetic field values not centered about the zero value.

19. The method of claim 18, wherein the first reference angle and the second reference angle enable the linear response to have the range of horizontal magnetic field values none of which have zero values.

20. The method of claim 12, further comprising:
connecting a first magnetoresistance element in series with a second magnetoresistance element; and
connecting a third magnetoresistance element in series with a fourth magnetoresistance element and in parallel with the first and second magnetoresistance elements.

21. A camera, comprising:
a magnetic field sensor comprising a bridge, the bridge comprising:
a first magnetoresistance element having a first reference angle;
a second magnetoresistance element in series with the first magnetoresistance element and having a second reference angle;
a third magnetoresistance element in parallel with the first magnetoresistance element and having the first reference angle; and
a fourth magnetoresistance element in series with the third magnetoresistance element and having the second reference angle;
a magnetic target;
a focus controller connected to the magnetic field sensor and connected to a lens; and
the lens,
wherein a movement of the magnetic target is detected by the magnetic field sensor to provide an output to the focus controller to change the focal length of the lens,
wherein an output of the bridge has a linear response over a range of horizontal magnetic field values not centered about a zero value, and
wherein the first reference angle and the second reference angle indicates an angle the magnetoresistance element has the largest change in resistance in response to a change in a magnetic field.

22. The camera of claim 21 wherein the camera is disposed in a cellular device.

* * * * *

UNITED STATES PATENT AND TRADEMARK OFFICE
CERTIFICATE OF CORRECTION

PATENT NO. : 11,467,233 B2  
APPLICATION NO. : 16/822488  
DATED : October 11, 2022  
INVENTOR(S) : Rémy Lassalle-Balier et al.

Page 1 of 1

It is certified that error appears in the above-identified patent and that said Letters Patent is hereby corrected as shown below:

In the Specification

Column 4, Line 51 delete "reference direction the" and replace with --reference direction. The--.

Column 4, Line 56 delete "a MR element" and replace with --an MR element--.

Column 5, Line 13 delete "is associate" and replace with --is associated--.

Column 5, Line 13 delete "tiled" and replace with --tilted--.

Column 5, Line 14 delete "a difference" and replace with --a different--.

Column 5, Line 21 delete "layer 222 (FIG.2)." and replace with --layer 222 (FIG. 2)).--.

Column 6, Line 64 delete "computers))." and replace with --computers).--.

Column 7, Line 33 delete "implemented as, special purpose" and replace with --implemented as special purpose--.

Column 7, Line 42 delete "in mobile phone." and replace with --in a mobile phone--.

Signed and Sealed this  
Twenty-sixth Day of December, 2023

Katherine Kelly Vidal  
*Director of the United States Patent and Trademark Office*